US009577177B1

(12) United States Patent
Brown et al.

(10) Patent No.: US 9,577,177 B1
(45) Date of Patent: Feb. 21, 2017

(54) SYSTEM AND METHOD FOR FABRICATING SUPER CONDUCTING CIRCUITRY ON BOTH SIDES OF AN ULTRA-THIN LAYER

(71) Applicant: The United States of America as represented by the Administrator of the National Aeronautics and Space Administration, Washington, DC (US)

(72) Inventors: Ari D. Brown, Baltimore, MD (US); Vilem Mikula, Hyattsville, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 15/164,365

(22) Filed: May 25, 2016

(51) Int. Cl.
H01L 39/24 (2006.01)
(52) U.S. Cl.
CPC .................................... H01L 39/24 (2013.01)

(58) Field of Classification Search
None
See application file for complete search history.

(56) References Cited

U.S. PATENT DOCUMENTS 5,578,226 A * 11/1996 Chan ...................... H01L 39/24
216/101
2012/0299175 A1 * 11/2012 Tran ........................ B82Y 10/00
257/712

* cited by examiner

Primary Examiner — Asok K Sarkar

(57) ABSTRACT

A method of fabricating circuitry in a wafer includes depositing a superconducting metal on a silicon on insulator wafer having a handle wafer, coating the wafer with a sacrificial layer and bonding the wafer to a thermally oxide silicon wafer with a first epoxy. The method includes flipping the wafer, thinning the flipped wafer by removing a handle wafer, etching a buried oxide layer, depositing a superconducting layer, bonding the wafer to a thermally oxidized silicon wafer having a handle wafer using an epoxy, flipping the wafer again, thinning the flipped wafer, etching a buried oxide layer from the wafer and etching the sacrificial layer from the wafer. The result is a wafer having superconductive circuitry on both sides of an ultra-thin silicon layer.

18 Claims, 4 Drawing Sheets

SYSTEM AND METHOD FOR FABRICATING SUPER CONDUCTING CIRCUITRY ON BOTH SIDES OF AN ULTRA-THIN LAYER

BACKGROUND

1. Technical Field

The present disclosure relates to fabricating superconductive circuitry and more specifically to a system and method of fabricating superconductive circuitry on both sides of an ultra-thin silicon layer.

2. Introduction

The present disclosure relates to fabricating superconducting circuitry. Certain applications require the fabrication of superconducting circuitry on both sides of an ultra-thin silicon wafer. Such a requirement can apply especially where ultra-low loss transmission lines and/or ultra-low crosstalk between superconducting sensors is required. A unique aspect of the problem that exists in this scenario is that the silicon wafer is so thin that handling it during the fabrication process is difficult with conventional tools. For example, a backing "handle wafer" is often required and some of the superconducting circuitry necessitates deposition on a heated substrate surface. Current processes focus on deposition of superconducting circuitry on both sides of an ultra-thin silicon wafer by depositing metal layers on one side of the device layer of a silicon on insulator wafer, bonding the front side of the wafer to a handle wafer with a polymeric epoxy, thinning the handle wafer on the silicon on insulator wafer, etching the buried oxide of the silicon on insulator wafer, and deposition of metal layers on the opposite side of the device there of a silicon on insulator wafer. The problems with this approach is that deposition of metal layers on one side of the silicon on insulator wafer have to be conducted at ambient temperatures in order to prevent damage to the polymer epoxy layer. Therefore, superconducting material deposited at high substrate temperature (such as temperatures greater than 200° C.) exhibit certain undesirable properties, such as a high conducting transition temperature or low microwave loss, and cannot be used successfully. Accordingly, what is needed in the art is an improved system and method related to how to fabricate superconducting circuitry on both sides of an ultra-thin silicon wafer.

SUMMARY

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Disclosed are systems, methods, and non-transitory computer-readable storage media for fabricating circuitry in a wafer. The method includes depositing and patterning a superconducting metal on a silicon on insulator wafer having a first handle wafer to yield a first wafer, and coating the first wafer with a sacrificial layer to yield a second wafer. The depositing can be performed at a high temperature. The range of temperatures encompassed would be known to one of skill in the art. The sacrificial layer can include a bi-layer having a first sacrificial layer of an anti-reflection coating and a second sacrificial layer of a copper thin film. This approach enables one to thin down the handle layer without damaging the silicon on insulator device layer. The reason for this disclosed process is to avoid roughing up or etching any part of a particular layer of the wafer.

The method further includes bonding the second wafer to a first thermally oxide silicon wafer having a second handle wafer with a first epoxy to yield a third wafer and flipping the third wafer to yield a flipped third wafer and thinning the flipped third wafer by removing the first handle wafer to yield a fourth wafer. The method includes etching a first buried oxide layer of the fourth wafer to yield a fifth wafer, depositing and patterning a superconducting layer on the fifth wafer to yield a sixth wafer, bonding the sixth wafer to a second thermally oxidized silicon wafer having a third handle wafer using a second epoxy to yield a seventh wafer and flipping the seventh wafer to yield a flipped seventh wafer. After the flipping, the method includes thinning the flipped seventh wafer by removing the second handle wafer to yield an eighth wafer, etching a second buried oxide layer from the eighth wafer to yield a ninth wafer and etching the sacrificial layer from the ninth wafer to yield a tenth wafer.

DETAILED DESCRIPTION

A system, method and computer-readable media are disclosed which related to a process for fabricating circuitry on a wafer. The particular approach uses a sacrificial layer at a certain place in the fabrication process to enable the ability to thin down or remove certain layers while avoiding damage to a silicon on insulator (SOI) device layer.

Various embodiments of the disclosure are described in detail below. While specific implementations are described, it should be understood that this is done for illustration purposes only. Other components and configurations may be used without parting from the spirit and scope of the disclosure.

Figure 1A:
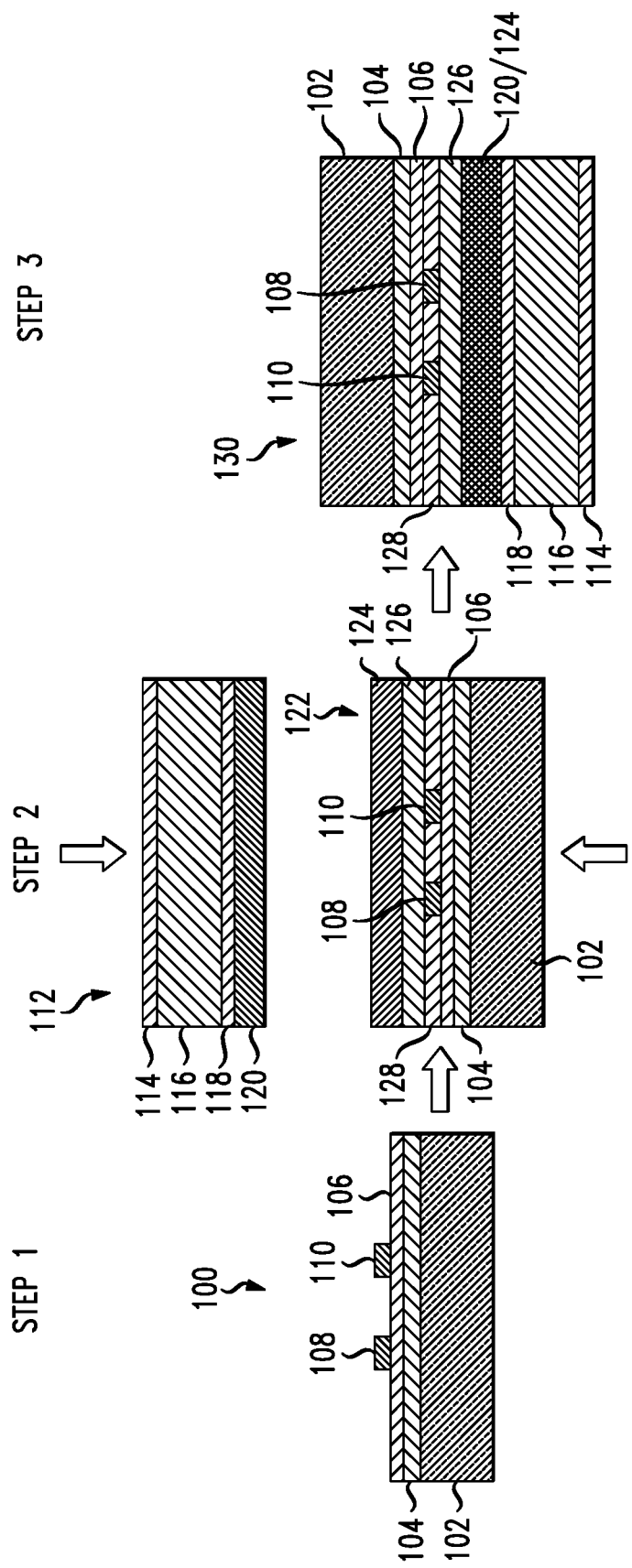
FIGS. 1A, 1B and 1C illustrates the various stages of development of the silicon chip according to the present disclosure.
Figure 1B:
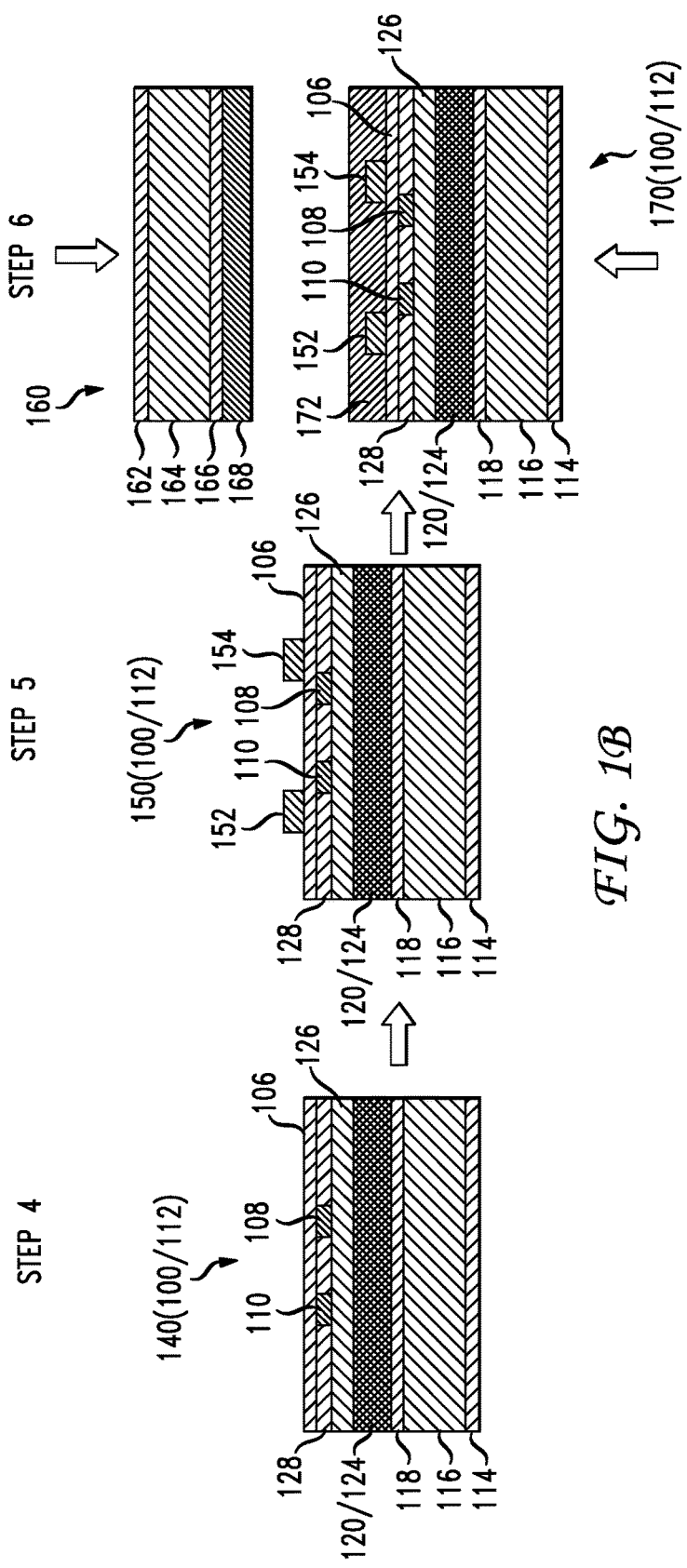
Figure 1C:
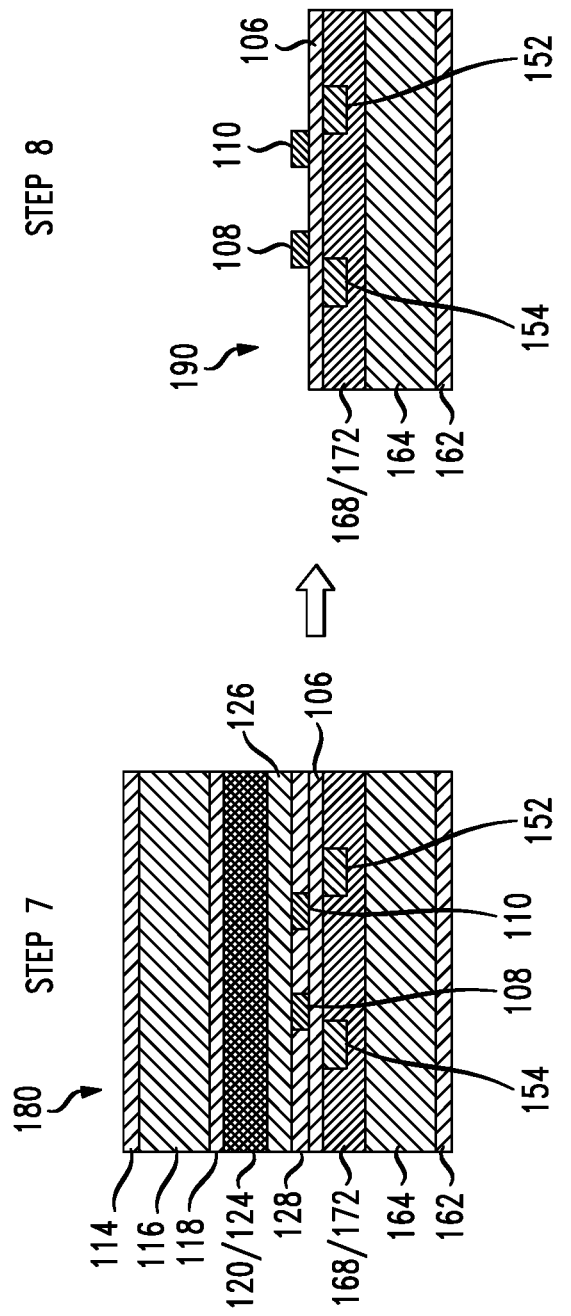
Figure 2:
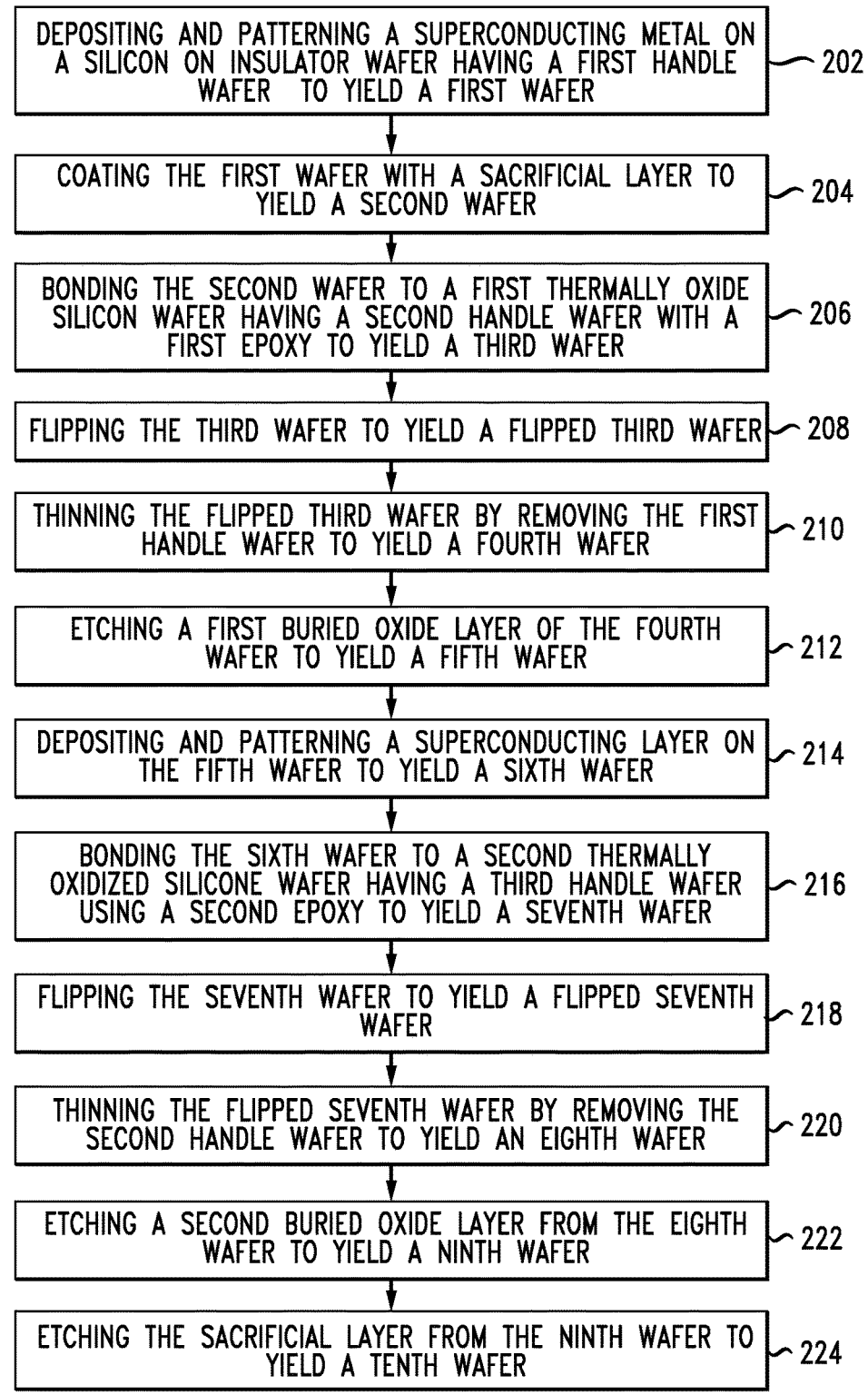
FIG. 2 illustrates a method example.

FIGS. 1A, 1B, 1C and 2 illustrate the various aspects of this disclosure and show the wafer at different steps in the process and FIG. 2 illustrates a method according to an aspect of this disclosure. As the figures are closely tied together, we shall discuss FIG. 2 with many references to features of FIGS. 1A, 1B and 1C. As shown in FIG. 2, a method of fabricating circuitry in a wafer, the method include depositing and patterning a superconducting metal on a silicon on insulator wafer having a first handle wafer 102 to yield a first wafer (202). This step 1 is shown in FIG. 1A in which the wafer 100 includes a silicon on insulator (SOI) handle wafer 102, a buried oxide layer 104, a SOI device wafer 106 and the superconducting metal 108, 110. The primary purpose of the concepts disclosed herein is to provide a fabrication process that prevents roughing or etching of the SOI device wafer 106. The use of the various handle wafers disclosed herein The method further includes coating the first wafer with a sacrificial layer 126/128 to yield a second wafer 122 (204). FIG. 1A illustrates, as part of step 2, the coating of the first wafer 100 with the sacrificial layer 126/128. The sacrificial layer 126/128 can include a polymeric sacrificial layer comprises an $O_2$ ash polymeric sacrificial layer. In another example, the sacrificial layer 126/128 is a bi-layer having a first sacrificial layer 128 of an anti-reflection coating (called Gen-Arc) and a second sacrificial layer 126 of a copper thin film. These layers are also interchangeable. The use of the sacrificial layer enables the manufacturer to thin down the sacrificial handle wafer 116 without damaging the silicon on insulator device layer 106. In the process, one does not want to rough in or etch any part of the SOI device wafer 106. The use of the sacrificial bi-layer and the flipping process disclosed herein enables the deposition of superconducting material on both sides of SOI device wafer 106 without damage.

Next, the method includes bonding the second wafer 122 to a first thermally oxide silicon wafer 112 having a second handle wafer 116 with a first epoxy 120/124 to yield a third wafer (206). Feature 112 is a separate substrate that is bonded to substrate 122. Note that the entire wafer 112 can also be termed a sacrificial handle wafer. The sacrificial handle wafer 112 also can include layers of a thermal silicon dioxide 114, 118 which can be, for example, on either side of the second handle wafer 116. The second handle wafer 116 is a sacrificial wafer as shall be seen. The use of the various handle wafers or handle layers is because the layer 106 can be 2 microns thick. The SOI device layer 106 is so thin, the various handle layers are needed for mechanical support for the creation of the final product.

With feature 106, one example material is to use silicon to make the layer. One could use, however, a silicon nitride layer, a sapphire layer or a silicon dioxide layer. The feature of using the sacrificial layer prevents the damage to whatever material is made for layer 106. One example application of the process is to make wafers that provide ultra-low-loss superconducting transmission lines. Any damage to the underlying substrate in this application results in loss due to the damaged region. If the substrate is damaged, the result is an increased surface area which increases dielectric loss. The surface area of interest is the interface between the atmosphere and the dielectric region. The goal in reducing damage is to reduce this surface area. Other applications can be to make superconducting resonator based spectrometers and superconducting parametric amplifiers. Any of these resulting devices can be example products. The disclosure covers also any product made by the process disclosed herein.

Next, the method includes flipping the third wafer to yield a flipped third wafer 130 (100/112) (208). As used herein, where a particular version of the product is referenced with other layers also referenced in parenthesis, it means that the new product includes at least in part a combination of some previous layers. For example, the third wafer 130 includes the basic SOI wafer 100 plus the sacrificial handle wafer 112. Wafer 130 is shown in FIG. 1A with the SOI handle wafer 102 now on top whereas before step 3, the SOI handle wafer 102 was on the bottom. Note the blending of the epoxy layers as feature 120/124. The epoxy used for layers 120, 124 can be, for example, a BCB (benzocyclobutene) epoxy layer. The method includes thinning the flipped third wafer by removing the first handle wafer 102 to yield a fourth wafer (210). The method next includes etching a first buried oxide layer 104 of the fourth wafer to yield a fifth wafer 150 (100/112) (212) as is shown in Step 4 of FIG. 1B. The etching can occur, for example, by placing the substrate in hydrochloric acid. Next, lithographic processing is applied to layer 106 by depositing and patterning a superconducting layer 152/154 on the fifth wafer to yield a sixth wafer (214) as is shown in step 5 of FIG. 1B. The superconducting layer 152/154 can be a metallization layer. Many circuits require pattern superconducting metal on both sides of the layer like layer 106.

The method next includes bonding the sixth wafer 170 (100/112) to a second thermally oxidized silicon wafer 160 having a third handle wafer 164 using a second epoxy 168/172 to yield a seventh wafer (216) as is shown in steps 6 and 7 of FIGS. 1B and 1C. To achieve the bonding, a step of applying an adhesive 168 to substrate 160 and an adhesive 172 to substrate 170 can be performed. The bonding is preferably achieved through the use of a bonding tool as would be known in the art. The third handle wafer 162 can include a layer of thermal silicon dioxide 162 and a second layer of thermal silicon dioxide 166. The second layer of oxide 168/172 can be made from BCB and/or CR-200 as an adhesive layer. The epoxy layers disclosed herein can be made from any adhesion. The method includes flipping the seventh wafer to yield a flipped seventh wafer 180 (100/112/160) (218) as shown in Step 7 of FIG. 1C. The method further includes thinning the flipped seventh wafer by removing the second handle wafer 116 to yield an eighth wafer (220) and etching a second buried oxide layer 118 from the eighth wafer to yield a ninth wafer (222) and etching the sacrificial layer 126/128 from the ninth wafer to yield a tenth wafer 190 (100/112/160) (224). The etching includes removing the dioxide layer 114 and the adhesive layer 120/124 as well. The sacrificial layer 126 can be a Cu (copper) layer, for example, and the sacrificial layer 126 can be a Gen-Arc sacrificial layer.

According to several other features, the epoxy can be a polymeric epoxy. Etching the sacrificial layer from the ninth wafer further includes etching a metallic sacrificial layer from the ninth wafer to yield an interim wafer and etching a polymeric sacrificial layer from the interim wafer to yield the tenth wafer.

The resulting product is shown as feature 190 (100/112/160) and includes the SOI device layer substrate 106 with metallization layers 152, 154 on one side of the substrate 106 and metallization 108, 110 on the top side of the substrate 106. As noted above, the resulting product can have many applications that require low loss.

Embodiments within the scope of the present disclosure may also include tangible and/or non-transitory computer-readable storage media for carrying or having computer-executable instructions or data structures stored thereon. Such tangible computer-readable storage media can be any available media that can be accessed by a general purpose or special purpose computer, including the functional design of any special purpose processor as described above. By way of example, and not limitation, such tangible computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection to a computer, the computer properly views the connection as a computer-readable medium. Thus, any such connection is properly termed a computer-readable medium.

Computer-executable instructions include, for example, instructions and data which cause a general purpose computer, special purpose computer, or special purpose processing device to control a group of components to perform a certain function or group of functions. Such components can include a spin coater, a wafer bonder, a physical vapor deposition tool—for instance, a sputtering deposition system, a mechanical lapper, a deep reactive ion etcher, and a programmable hot plate. Other components can also be used which would be known to those of skill in the art. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Any such computing device will include the basic hardware components such as a processor, a bus, memory, input/output devices, and so forth. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. Various modifications and changes may be made to the principles described herein without following the example embodiments and applications illustrated and described herein, and without departing from the spirit and scope of the disclosure.

We claim:

1. A method of fabricating circuitry in a wafer, the method comprising:
    depositing and patterning a superconducting metal on a silicon on insulator wafer having a first handle wafer to yield a first wafer;
    coating the first wafer with a sacrificial layer to yield a second wafer;
    bonding the second wafer to a first thermally oxide silicon wafer having a second handle wafer with a first epoxy to yield a third wafer;
    flipping the third wafer to yield a flipped third wafer;
    thinning the flipped third wafer by removing the first handle wafer to yield a fourth wafer;
    etching a first buried oxide layer of the fourth wafer to yield a fifth wafer;
    depositing and patterning a superconducting layer on the fifth wafer to yield a sixth wafer;
    bonding the sixth wafer to a second thermally oxidized silicon wafer having a third handle wafer using a second epoxy to yield a seventh wafer;
    flipping the seventh wafer to yield a flipped seventh wafer;
    thinning the flipped seventh wafer by removing the second handle wafer to yield an eighth wafer;
    etching a second buried oxide layer from the eighth wafer to yield a ninth wafer; and
    etching the sacrificial layer from the ninth wafer to yield a tenth wafer.

2. The method of claim 1, wherein the depositing is performed at a high temperature.

3. The method of claim 1, wherein the sacrificial layer comprises a polymeric sacrificial layer comprises an $O_2$ ash polymeric sacrificial layer.

4. The method of claim 1, wherein the sacrificial layer comprises a bi-layer having a first sacrificial layer of an anti-reflection coating and a second sacrificial layer of a copper thin film.

5. The method of claim 1, wherein the epoxy is a polymeric epoxy.

6. The method of claim 1, wherein etching the sacrificial layer from the ninth wafer further comprises etching a metallic sacrificial layer from the ninth wafer to yield an interim wafer and etching a polymeric sacrificial layer from the interim wafer to yield the tenth wafer.

7. A system comprising:
    a processor; and
    a computer-readable storage device storing instructions which, when executed by the processor, cause the processor to perform operations comprising:
    depositing and patterning a superconducting metal on a silicon on insulator wafer having a first handle wafer to yield a first wafer;
        coating the first wafer with a sacrificial layer to yield a second wafer;
        bonding the second wafer to a first thermally oxide silicon wafer having a second handle wafer with a first epoxy to yield a third wafer;
        flipping the third wafer to yield a flipped third wafer;
        thinning the flipped third wafer by removing the first handle wafer to yield a fourth wafer;
        etching a first buried oxide layer of the fourth wafer to yield a fifth wafer;
        depositing and patterning a superconducting layer on the fifth wafer to yield a sixth wafer;
        bonding the sixth wafer to a second thermally oxidized silicon wafer having a third handle wafer using a second epoxy to yield a seventh wafer;
        flipping the seventh wafer to yield a flipped seventh wafer;
        thinning the flipped seventh wafer by removing the second handle wafer to yield an eighth wafer;
        etching a second buried oxide layer from the eighth wafer to yield a ninth wafer; and
        etching the sacrificial layer from the ninth wafer to yield a tenth wafer.

8. The system of claim 7, wherein the depositing is performed at a high temperature.

9. The system of claim 7, wherein the sacrificial layer comprises a polymeric sacrificial layer comprises an O2 ash polymeric sacrificial layer.

10. The system of claim 7, wherein the sacrificial layer comprises a bi-layer having a first sacrificial layer of an anti-reflection coating and a second sacrificial layer of a copper thin film.

11. The system of claim 7, wherein the epoxy is a polymeric epoxy.

12. The system of claim 7, wherein etching the sacrificial layer from the ninth wafer further comprises etching a metallic sacrificial layer from the ninth wafer to yield an interim wafer and etching a polymeric sacrificial layer from the interim wafer to yield the tenth wafer.

13. A computer-readable storage device storing instructions which, when executed by a processor, cause the processor to control a group of components to perform operations comprising:
- depositing and patterning a superconducting metal on a silicon on insulator wafer having a first handle wafer to yield a first wafer;
- coating the first wafer with a sacrificial layer to yield a second wafer;
- bonding the second wafer to a first thermally oxide silicon wafer having a second handle wafer with a first epoxy to yield a third wafer;
- flipping the third wafer to yield a flipped third wafer;
- thinning the flipped third wafer by removing the first handle wafer to yield a fourth wafer;
- etching a first buried oxide layer of the fourth wafer to yield a fifth wafer;
- depositing and patterning a superconducting layer on the fifth wafer to yield a sixth wafer;
- bonding the sixth wafer to a second thermally oxidized silicon wafer having a third handle wafer using a second epoxy to yield a seventh wafer;
- flipping the seventh wafer to yield a flipped seventh wafer;
- thinning the flipped seventh wafer by removing the second handle wafer to yield an eighth wafer;
- etching a second buried oxide layer from the eighth wafer to yield a ninth wafer; and
- etching the sacrificial layer from the ninth wafer to yield a tenth wafer.

14. The computer-readable storage device of claim 13, wherein the depositing is performed at a high temperature.

15. The computer-readable storage device of claim 13, wherein the sacrificial layer comprises a polymeric sacrificial layer comprises an $O_2$ ash polymeric sacrificial layer.

16. The computer-readable storage device of claim 13, wherein the sacrificial layer comprises a bi-layer having a first sacrificial layer of an anti-reflection coating and a second sacrificial layer of a copper thin film.

17. The computer-readable storage device of claim 13, wherein the epoxy is a polymeric epoxy.

18. The computer-readable storage device of claim 13, wherein etching the sacrificial layer from the ninth wafer further comprises etching a metallic sacrificial layer from the ninth wafer to yield an interim wafer and etching a polymeric sacrificial layer from the interim wafer to yield the tenth wafer.

* * * * *